(12) United States Patent
Nguyen Van Dau et al.

(10) Patent No.: US 6,496,004 B1
(45) Date of Patent: Dec. 17, 2002

(54) MAGNETIC FIELD SENSOR USING MAGNETO-RESISTANCE OF FERROMAGNETIC LAYERS WITH PARALLEL MAGNETIC AXES

(75) Inventors: Frédéric Nguyen Van Dau; Alain Schuhl, both of Palaiseau; Armando Encinas, Paris, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/601,333

(22) PCT Filed: Dec. 10, 1999

(86) PCT No.: PCT/FR99/03101

§ 371 (c)(1),
(2), (4) Date: Aug. 10, 2000

(87) PCT Pub. No.: WO00/36429

PCT Pub. Date: Jun. 22, 2000

(30) Foreign Application Priority Data

Dec. 11, 1998 (FR) .............................. 98 15697

(51) Int. Cl.⁷ .................. G01F 33/09; G01F 33/02; H01L 43/08; H01L 43/12
(52) U.S. Cl. ............. 324/252; 324/249; 388/32 R; 428/692
(58) Field of Search .................. 324/252, 249; 338/32 R; 360/324, 325; 428/692

(56) References Cited

U.S. PATENT DOCUMENTS 4,949,039 A * 8/1990 Grunberg .................... 324/252

FOREIGN PATENT DOCUMENTS

| DE | 19649265 | * | 6/1998 |
| EP | 0693791 | * | 1/1996 |
| EP | 0710850 | * | 5/1996 |
| FR | 2752302 | * | 2/1998 |
| WO | WO 9616339 | * | 5/1996 |
| WO | WO 9825155 | * | 6/1998 |

OTHER PUBLICATIONS

Sprong, Giant magnetoresistive spinvalve sensor, IEEE Transactions on magnetics vol. 32, no. 1 Mar. 1996.*

* cited by examiner

*Primary Examiner*—Walter E. Snow
(74) *Attorney, Agent, or Firm*—Oblon, Spivak, McClelland, Maier & Neustadt, P.C.

(57) ABSTRACT

A magnetic detector which includes a first thin-layer element and a second thin-layer element made of magnetic material with magnetic anisotropy in the plane possessing, in this plane, two easy axes of magnetization. A coercive field of one of the first and second thin-layer elements has a value different from that of the other thin-layer element. The two thin-layer elements have elongated and mutually parallel shapes perpendicular to their direction of easy magnetization in the absence of a magnetic field. The width of these thin-layer elements is such that it obliges at least one of the thin-layer elements to have its magnetization oriented along the length of the thin-layer element when there is no external magnetic field. Such a magnetic field sensor may find particular application to the measurement of magnetic fields.

22 Claims, 3 Drawing Sheets

MAGNETIC FIELD SENSOR USING MAGNETO-RESISTANCE OF FERROMAGNETIC LAYERS WITH PARALLEL MAGNETIC AXES

BACKGROUND OF THE INVENTION

1. Field of the Invention

The invention relates to a magnetoresistive sensor using the magnetoresistance of ferromagnetic materials. A sensor of this kind is designed to detect magnetic fields. In the field of low frequencies (continuous frequencies at 100 Hz typically), the two noise sources that limit the resolution of this type of sensor are the resistance fluctuation noise or Johnson noise and the thermal drift noise. Furthermore, in this type of sensor, two different magnetoresistive effects can be used: anisotropic magnetoresistance and giant magnetoresistance.

2. Discussion of the Background

The anisotropic magnetoresistance effect results from the dependence of the resistivity of a ferromagnetic material on the angle between its magnetization and the direction of the current. Owing to the anisotropic character of this physical effect, two measurement geometries can be considered: longitudinal geometry and the transversal geometry (planar Hall effect). The French patents 92 15551, 95 05659 and 96 08385 describe planar Hall effect sensors, especially with respect to the reduction of thermal drift noise. The total exploitable effect is in the range of 1% of the resistance of the active zone. The Johnson noise is associated with the same resistance which is in the range of the resistance per square unit of the film in terms of planar Hall effect geometry.

The effect of giant magnetoresistance was discovered in 1988 (see M. Baibich et al., Physic Review Letters, 61, 2472 (1988)) and results from the spin dependence of the resistance of a magnetic structure that can have an arrangement of magnetizations that differs according to the external magnetic field. The total exploitable effect may be in the range of 10% of the resistance of the active zone. Furthermore, since the geometry of measurement of this effect is necessarily longitudinal, the active zone can be sized in such a way that its resistance attains several tens of times the resistance per square unit of the film, the voltage equivalent of the Johnson noise increasing as the square root of the resistance. It can therefore be seen that the use of the giant magnetoresistance effect, especially with respect to sensors using the planar Hall effect, has two main advantages: an increase in the amplitude of the useful signal that is certainly capable of attaining one order of magnitude as well as an increase in the signal-to-noise ratio which too can attain a factor of ten.

SUMMARY OF THE INVENTION

The invention proposes to use the technique of giant magnetoresistance to obtain a linearizing of the signal and reduce the noise of thermal drift.

The invention therefore relates to a magnetic detector comprising a first thin-layer element made of magnetic material with magnetic anisotropy in the plane of the thin layer possessing, in this plane, an easy magnetization axis, characterized in that it comprises a second thin-layer element parallel to the first element, this second element being made of magnetic material with magnetic anisotropy in the plane and having, in this plane, an easy magnetization axis parallel to that of the first element, the coercive field of the second element having a value different from that of the first element, the two elements having elongated and mutually parallel shapes perpendicular to their direction of easy magnetization in the absence of a magnetic field and the width of these elements being such that it obliges at least one of the elements to have its magnetization, when there is no external magnetic field, oriented along the length of the element.

BRIEF DESCRIPTION OF THE DRAWINGS

The various objects and characteristics of the invention shall appear in the following description given by way of an example and in the appended figures, of which.

DESCRIPTION OF THE PREFERRED EMBODIMENTS

Figure 1A:
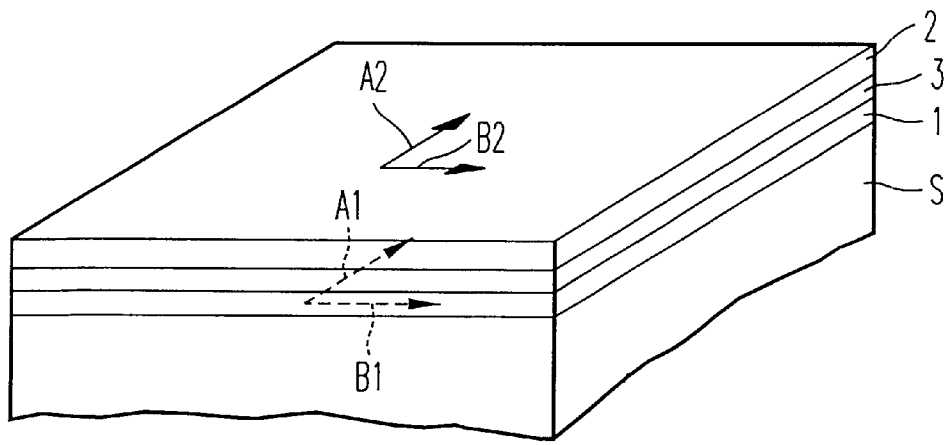
FIGS. 1a to 1c show an exemplary embodiment of a device according to the invention.
Figure 1B:
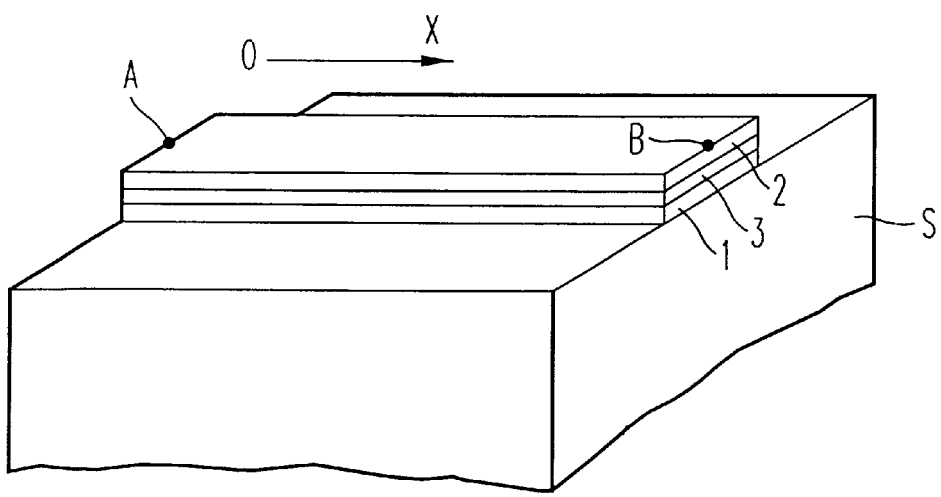

FIGS. 1a and 1b describe a basic sensor according to the invention and its method of manufacture. On a substrate S, two superimposed layers of crystalline magnetoresistive materials are made, both having a magnetic anisotropy in the plane. The two layers have their easy magnetization axes (A1-B1, A2-B2) in the absence of parallel magnetic field. The coercive fields of the two layers have different values. In other words, one of the layers (the layer 1 for example) is a hard magnetic material and the other layer is a soft magnetic material (the layer 2). Preferably, the two layers are separated by a non-magnetic layer 3.

When these layers have been made, an element with an elongated shape, having the form of a strip, is made in these layers. This strip is oriented along an axis OX perpendicular to the direction of magnetization of the layers when there is no external magnetic field. The width of the strip is such it forces the magnetization of only one of the layers (the layer of soft magnetic material) to get oriented parallel to the axis OX. When there is no magnetic field, there is therefore, in the element obtained, one layer whose magnetization is perpendicular to the axis OX and the other layer whose magnetization is parallel to the axis OX.

For example, one of the layers is made of iron-nickel and the other is made of cobalt.

The making of a strip in the layers 1 and 2 can be done either by etching the strip in the layers 1 and 2 or by any method that destroys the magnetism and conductive nature on either side of the strip.

At both ends A and B of the sensor obtained, electrical contacts are then made to connect devices (not shown) to measure the resistance of the element.

Figure 1C:
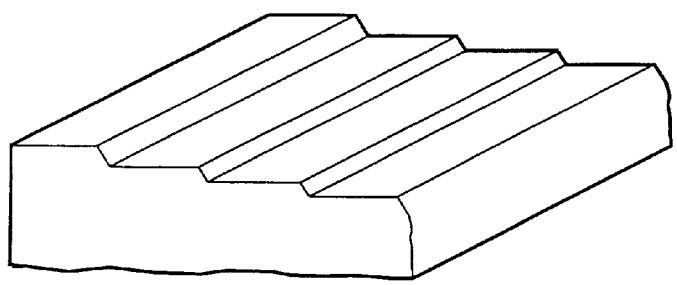

The sensor thus described is the active component of a magnetic field detector using the giant magnetoresistance of a magnetic structure in which a single-axis magnetic anisotropy is generated in each of the magnetic elements forming the structure. An active material of this kind may be for example a spin valve type structure (for example Co/Cu/FeNi) deposited on a surface with modulated topology (it is possible for example to use the properties of faceting of stepped silicon surfaces) as shown in FIG. 1 (see document by A. Encinas et al. in Applied Physics Letters, 71, December 1997). In order to manufacture a magnetic field sensor, it is thus possible to exploit the possibility of controlling a single-axis magnetic anisotropy in each of the layers, which is counterbalanced by a shape anisotropy related to the shape of the structure. The approach of the invention leads to a significant simplification of the technology as compared with known techniques such as the one described in J. Daughton et al., IEEE Trans. Magn., 30, 4608 (1994).

Figure 2A:
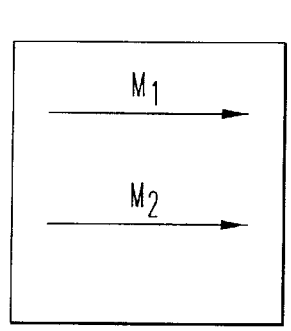
FIGS. 2a, 2b show a standard type of giant magnetoresistance sensor.
Figure 2B:
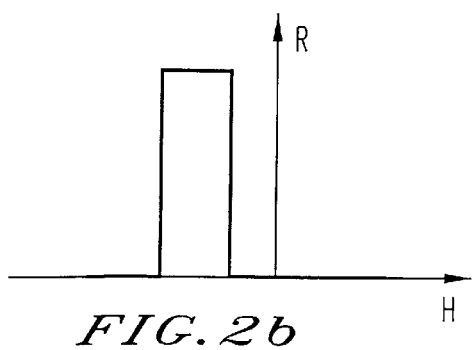

FIGS. 2a and 2b respectively show a standard giant magnetoresistance structure and its response curve. FIG. 2a shows a parallel orientation of magnetizations in zero fields. FIG. 2a shows a discontinuous response (resistance/magnetization) of the sensor wherein the response signal is constant in a weak field.

Figure 3A:
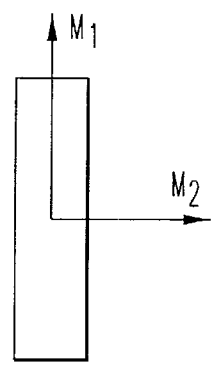
FIGS. 3a, 3b show the sensor according to the invention.
Figure 3B:
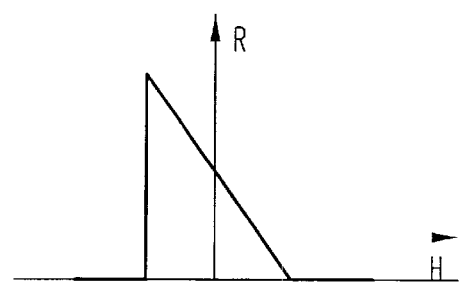

FIGS. 3a and 3b respectively show the structure according to the invention and its field of response to the magnetic field. The curve of FIG. 3b shows a linear response zone.

The response signal can be expressed by the formula:

$$R_1 = R_0 + SH$$

where:

$R_0$ designates the offset,

S designates the slope of the response curve,

H designates the external magnetic field.

Starting from a structure which already has a fixed axis of anisotropy, the invention, by cutting up the strips perpendicularly to this axis, gives a configuration where the zero field magnetizations of the two layers are perpendicular. The anisotropy induced by the cutting up runs counter to the initial anisotropy and, for each of the layers, there is a threshold bandwidth below which the axis of easy magnetization becomes parallel to the strip and therefore rotates by 90° with respect to the initial situation. The magnetic configuration aimed at is obtained when only one of the two layers has its anisotropy controlled by the cutting up.

Depending on the thickness of the layers, our estimates indicate that the strips should be cut up with widths of typically 1 and 10 $\mu$m making the method accessible by the techniques of optical lithography.

Figure 4:
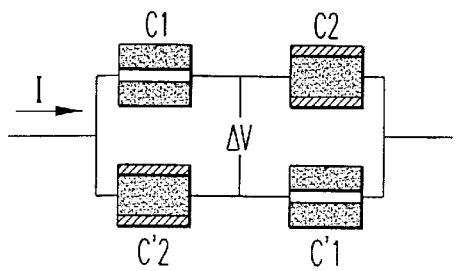
FIG. 4 shows a Wheatstone bridge assembly of sensors according to the invention.

FIG. 4 shows a Wheatstone bridge assembly with four sensors used to overcome thermal drifts. Two sensors C1 and C'1 of the two opposite arms of the bridge are of the type according to the invention and the other two sensors C2 and C'2 are of the type shown in FIGS. 2a and 2b. In the latter sensors, the magnetoresistance signal is constant $R_2 = R_0$ on a range of magnetic field corresponding to the coercivity of the softest magnetic material.

The assembly of FIG. 4 subtracts the resistance $R_0$, which is the main source of thermal drift. Indeed, the signal at the output of the bridge can be written as follows:

$$\Delta V/I = (R_1^2 - R_2^2)/(2R_1 + 2R_2) = 1/2 . S.H \qquad (2)$$

Figure 5:
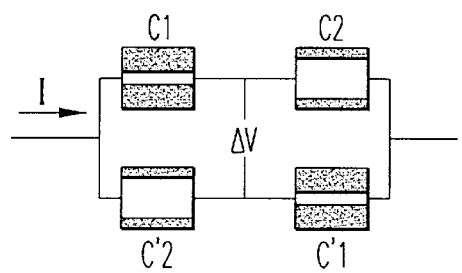
FIGS. 5 and 6 show embodiments of the Wheatstone bridge of FIG. 4.

The sensors C1 and C'1 being defined by sectioning the magnetic structure and, furthermore, the resistance of such a sensor being basically related to its dimensions, it is necessary to choose two patterns in such a way that the second sensors have the same resistance. This balances the bridge. FIG. 5 shows an approach used to attain this goal.

In FIG. 5, the two types of sensors C1/C'1 and C2/C'2 consist of strips sectioned perpendicularly to the main axis of anisotropy with different bandwidths.

For C1/C'1 type sensors, the width of the strips $w_1$ is chosen to be low enough to obtain the 90° magnetic configuration described here above, thus enabling the linearization of the magnetoresistive signal. These sensors therefore show a response $R_1 = R_0 + S.H$. For the C2/C'2 type sensors, the width of the strips $w_2$ is chosen to be greater in such a way that the two magnetic layers keep their easy axis parallel to the initial axis of anisotropy. This response will therefore be $R_2 = R_0$. The two types of sensors are organized as shown in FIG. 5.

The number of parallel-connected strips serves to control the resistance level. Indeed, if i (i=1 or 2) type sensor includes $n_i$ parallel-connected strips with a width $w_i$, its resistance $R_i$ is proportional to $(n_i . w_i)_{-1}$. It is therefore enough to choose $n_1$, $n_2$, $w_1$, $w_2$ in such a way that $n_1 . w_1 = n_2 . w_2$.

Figure 6:
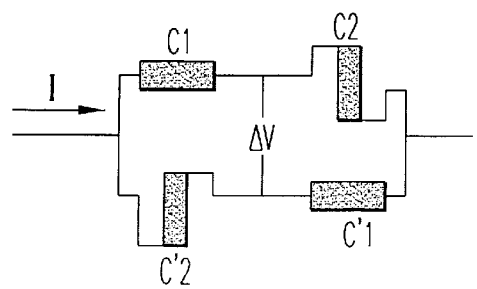

In FIG. 6, the two types of sensors C1/C'1 and C2/C'2 are made with the same pattern. However, for the C2/C'2 type sensors, the pattern is oriented in parallel to the initial axis of anisotropy and no longer perpendicularly. Consequently, the shape anisotropy induced by the cutting up of the strips gets added to (and no longer opposes) the initial anisotropy in such a way that the magnetoresistance signal of the sensor keeps the initial form (FIG. 2b). The two types of sensors are organized as shown in FIG. 6.

Figure 7A:
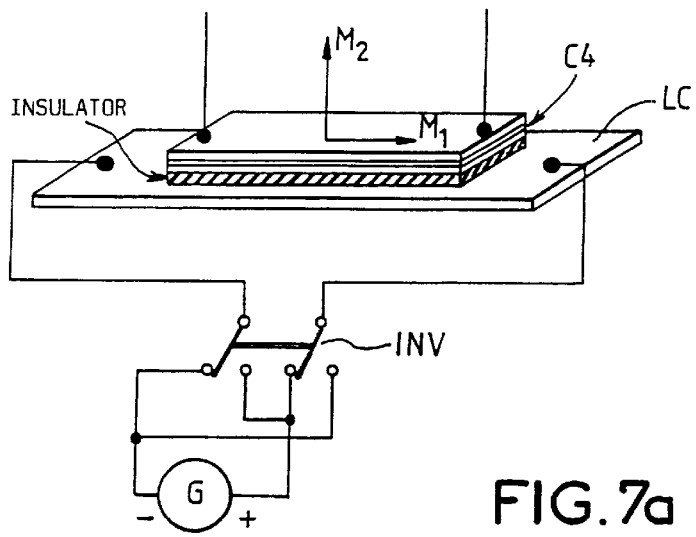
FIGS. 7a to 7c show a device according to the invention comprising a current conducting line.

According to one alternative embodiment, the Wheatstone bridge assembly is eliminated. It is then planned to orient the magnetization of one of the two layers by means of an electrical control line. The sensor is therefore formed by a single magnetoresistive component subdivided so as to linearize the magnetoresistance signal. On top of this component C4 or beneath it, there is an electrical control line LC (control strip LC) that generates a magnetic field in the component. The direction of one of the two magnetizations (for example $M_2$) of the component is controlled by applying a current having a controlled sign. FIG. 7a shows this device. A current generator G is connected by an inverter INV to the control line LC.

Figure 7B:
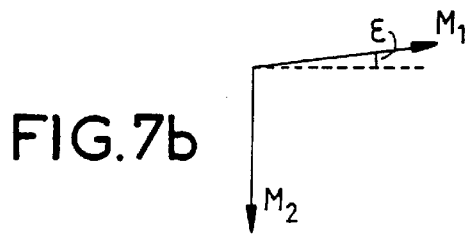

By applying a current +I in the control line, the magnetization $M_2$ due to the current has a given sense and, for a field to be detected parallel to the direction, the angle between the two magnetizations of the active structure is 90+$\epsilon$ (FIG. 7b). The response of the sensor is then equal to: $R_0 + S.H$.

Figure 7C:
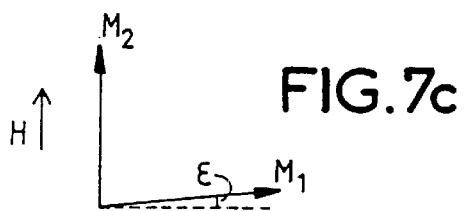

By applying a current −I to the control line LC and, therefore, through a reversal of the magnetization $M_2$, the angle becomes 90−$\epsilon$ (FIG. 7c) and the response of the sensor $R_0 − S.H$. The electronic difference between the two responses makes it possible to subtract the DC component $R_0$ from the element (responsible for the thermal drift) and to keep only the useful signal 2.S.H. It must be noted that, as compared with bridge assemblies, this approach provides a gain by a factor of 4 in the amplitude of the useful signal before any amplification.

What is claimed is:

1. Magnetic detector comprising a first thin-layer element made of magnetic material with magnetic anisotropy in the plane of the thin layer possessing, in this plane, two easy magnetization axes, characterized in that it comprises a second thin-layer element parallel to the first element, this second element being made of magnetic material with magnetic anisotropy in the plane and possessing, in this plane, two easy magnetization axes parallel to the axes of the first element, the coercive field of the second element having a value different from that of the first element, the two elements having elongated and mutually parallel shapes perpendicular to their direction of easy magnetization in the absence of a magnetic field and the width of these elements being such that it obliges at least one of the elements to have its magnetization oriented along the length of the element.

2. Magnetic detector according to claim 1, characterized in that the width of one element obliges its magnetization in a zero field to be oriented along the length of the element and in that the width of the other element is such that its magnetization in zero field is oriented perpendicularly to the length of the element.

3. Detector according to claim 1, characterized in that it comprises a conductive layer of a non-magnetic material between the first and the second elements.

4. Magnetic detector characterized in that it comprises at least two first elementary detectors according to claim 1, arranged in two branches of a measuring bridge, the other two arms comprising two elementary detectors used to correct the offset response.

5. Magnetic detector according to claim 4, characterized in that the four detectors are made in the same types of layers and oriented in parallel and in that the two second detectors have widths such that they do not dictate an orientation of the magnetizations when there is no magnetic field.

6. Magnetic detector according to claim 4, characterized in that the four detectors are made in the same types of layers and oriented in parallel and in that the two second detectors have the shape of a strip making one of the layers have its magnetization when there is no magnetic field oriented along the length of the strip, each strip being oriented perpendicularly to the direction of the strips of the first detectors.

7. Magnetic detector according to claim 1, characterized in that it comprises an electrical conductor parallel to the elongated direction of said elements, said detector being associated with one face of one of the elements but being isolated from this element so as to be able to induce a magnetic field in said detector.

8. Magnetic detector according to claim 7, characterized in that it comprises means for the circulation, in said conductor, of a current in a first direction and then in a second direction.

9. Method for making a detector, characterized in that it comprises the following steps:

a) the making, on a substrate, of at least two superimposed layers of crystalline magnetoresistive materials with magnetic anisotropy in their plane, each having two parallel easy axes of magnetization, the coercive fields of the two materials having different values;

b) the making, in one of these layers, of at least one element having a shape elongated in a direction parallel to the easy direction of magnetization of the two layers when there is no magnetic field; the width of the element being such that it obliges at least one of the elements have its magnetization oriented along the length of the element.

10. Method according to claim 9, characterized in that it provides for the making of four elementary detectors in the two layers of magnetoresistive materials.

11. Method according to claim 10, characterized in that two elementary detectors are made in the form of strips whose width dictates the orientation of the magnetization of a layer when there is no magnetic field along the length of the strip.

12. Method according to claim 10, characterized in that the four elementary detectors are made in strip form, two elementary detectors being perpendicular to the other two.

13. Method according to claim 9 further comprising:

providing an electrical conductor parallel to the elongated direction, said detector being associated with one face of the one element but being isolated from the one element so as to be able to induce a magnetic field in said detector.

14. Method according to claim 13 further comprising:

circulating, in said conductor, a current in a first direction and then in a second direction.

15. A magnetic field detector comprising:

a first layer of magnetic material configured to have a first easy magnetization axis and a second easy magnetization axis;

a second layer of magnetic material having a third easy magnetization axis and a fourth easy magnetization axis, a coercive field of the second layer being different from a coercive field of the first layer; and an insulation layer disposed between the first layer and the second layer, wherein the first layer, the insulation layer and the second layer are configured in an elongated stack having a length and a width;

wherein, in the absence of an external magnetic field, the width of the elongated stack is such that the second layer's magnetization becomes parallel to the length of the stack while the first layer's magnetization remains perpendicular to the length of the stack.

16. The magnetic field detector of claim 15 wherein the insulation layer is a conductive layer of non-magnetic material.

17. The magnetic field detector of claim 15 wherein a first elementary detector comprises the first, second, third and fourth layers and the insulation layer, said magnetic field detector further comprising:

a second elementary detector;

wherein the first and second elementary detectors are arranges as branches of a measuring bridge.

18. The magnetic field detector of claim 17 further comprising:

a third elementary detector; and a fourth elementary detector;

wherein the third and fourth elementary detectors are configured to correct an offset response.

19. A method of making a magnetic field detector comprising:

providing a first layer of magnetic material with a first easy magnetization axis and a second easy magnetization axis;

providing a second layer of magnetic material having a third easy magnetization axis and a fourth easy magnetization axis, a coercive field of the second layer being different from a coercive field of the first layer;

providing an insulation layer between the first layer and the second layer; and configuring the first layer, the insulation layer and the second layer in an elongated stack having a length and a width;

wherein, in the absence of an external magnetic field, the width of the elongated stack is such that the second layer's magnetization becomes parallel to the length of the stack while the first layer's magnetization remains perpendicular to the length of the stack.

20. The method according to claim 19 further comprising:

circulating, in said conductor, a current in a first direction and then in a second direction.

21. The method according to claim 19 wherein the first, second, third and fourth layers and the insulation layer are part of a first elementary detector, said method further comprising:
  providing a second elementary detector; and
  arranging the first and second elementary detectors as branches of a measuring bridge.

22. The method according to claim 21 further comprising:
  providing a third elementary detector;
  providing a fourth elementary detector; and
  configuring the third and fourth elementary detectors to correct an offset response.

* * * * *